United States Patent [19]
Nagasawa

[11] Patent Number: 5,177,378
[45] Date of Patent: Jan. 5, 1993

[54] SOURCE-COUPLED FET LOGIC CIRCUIT

[75] Inventor: Hironori Nagasawa, Yokohama, Japan

[73] Assignee: Kabushiki Kaisha Toshiba, Kawasaki, Japan

[21] Appl. No.: 696,743

[22] Filed: May 7, 1991

[30] Foreign Application Priority Data

May 8, 1990 [JP] Japan ............... 2-116836

[51] Int. Cl.⁵ .............. H03K 19/017; H03K 19/20
[52] U.S. Cl. ............................... 307/448; 307/450
[58] Field of Search ...................... 307/498, 450

[56] References Cited

U.S. PATENT DOCUMENTS

| | | | |
|---|---|---|---|
| 4,558,235 | 12/1985 | White et al. | 307/448 |
| 4,663,543 | 5/1987 | Sitch | 307/448 |
| 4,701,646 | 10/1987 | Richardson | 307/570 |
| 4,814,835 | 3/1989 | Tung | 357/22 |
| 4,963,948 | 10/1990 | Awano | 357/16 |
| 5,021,857 | 6/1991 | Suehiro | 357/42 |

FOREIGN PATENT DOCUMENTS

| | | |
|---|---|---|
| 60-183764 | 9/1985 | Japan. |
| 60-134481 | 11/1985 | Japan. |
| 60-176277 | 1/1986 | Japan. |
| 63-46779 | 2/1988 | Japan. |
| 1-167193 | 5/1989 | Japan. |
| 1-227478 | 9/1989 | Japan. |

Primary Examiner—Edward P. Westin
Assistant Examiner—Andrew Sanders
Attorney, Agent, or Firm—Finnegan, Henderson, Farabow, Garrett and Dunner

[57] ABSTRACT

A source-coupled FET logic (SCFL) circuit having a switching section and a source-follower section. The switching section receives two input signals, and outputs two signals, which are at complementary levels, to the source-follower section. The source-follower section comprises two FETs, two level-shifting circuits, a current source, and two capacitors. The first and second FETs receive at their gates the two signals output by the switching section, respectively. The first and second level-shifting circuits are connected to the sources of the first and second FETs, respectively. Either level-shifting circuit comprises n diodes connected in series. The two capacitors are connected in parallel to the first and second level-shifting circuits, respectively.

1 Claim, 4 Drawing Sheets

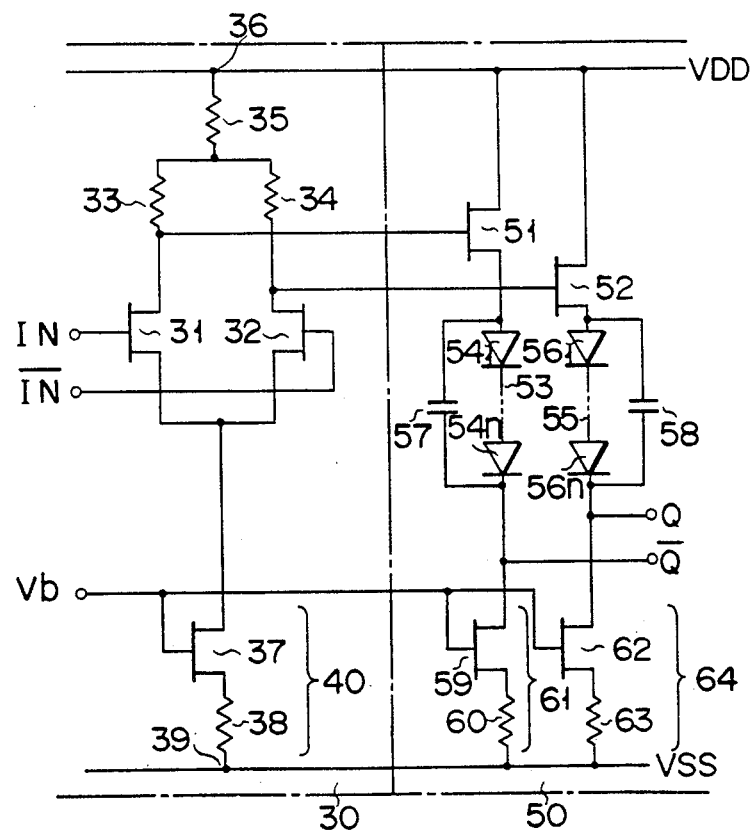
F I G. 2

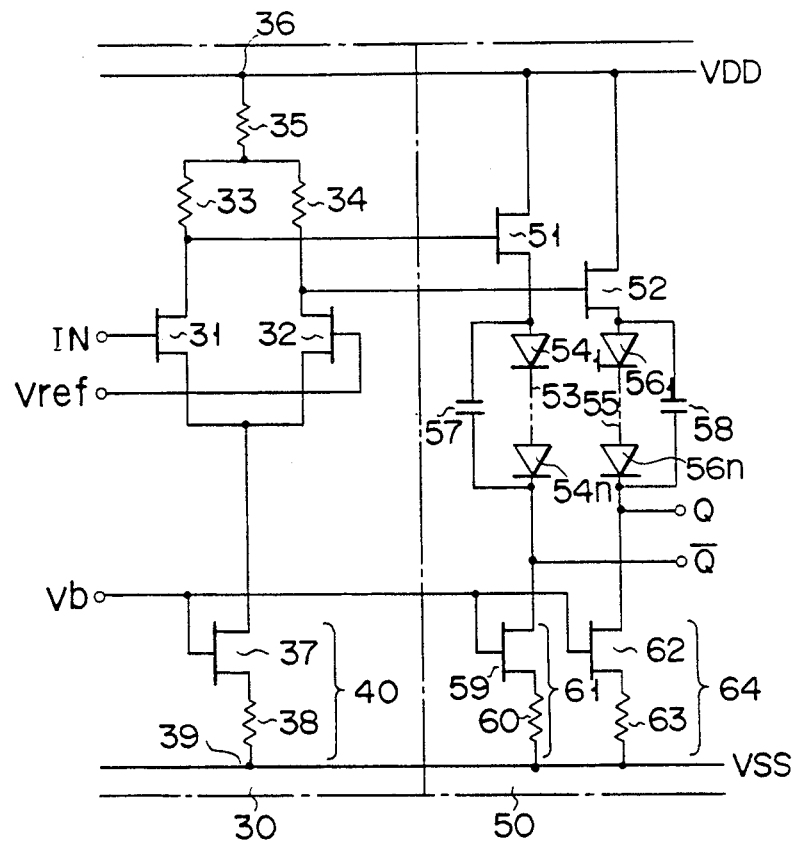
F I G. 3
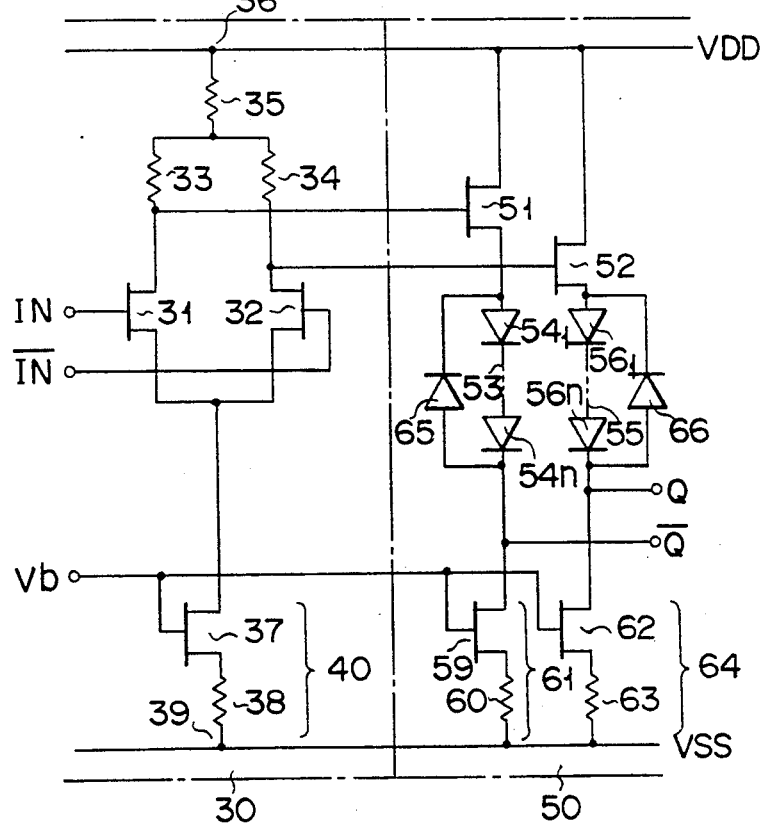
F I G. 4

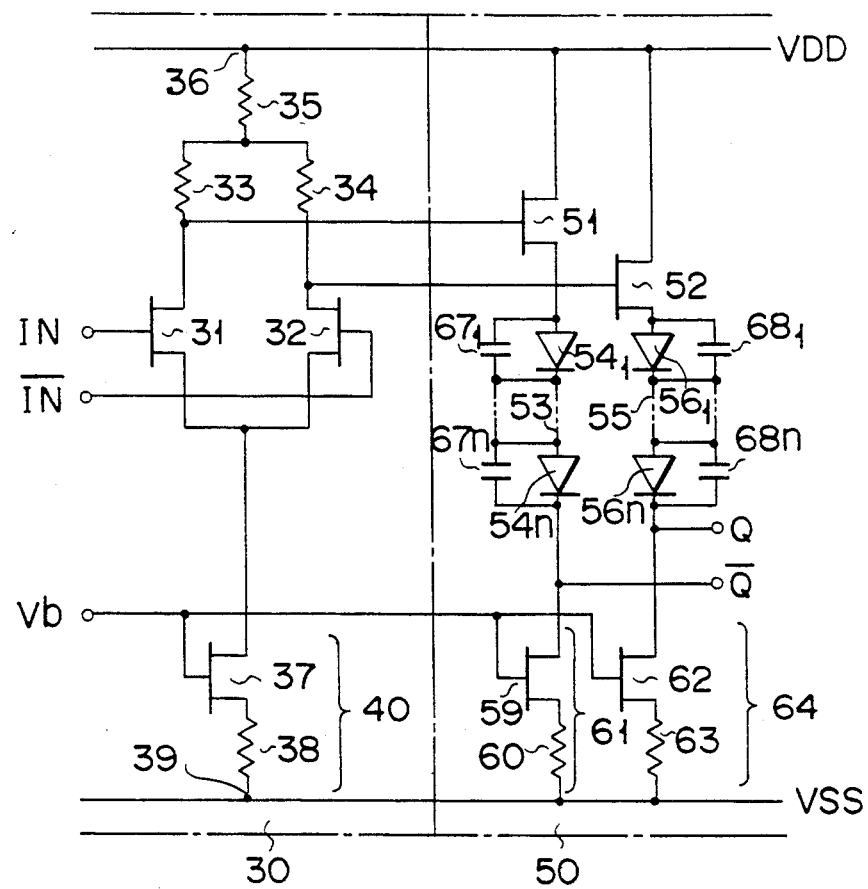
F I G. 5
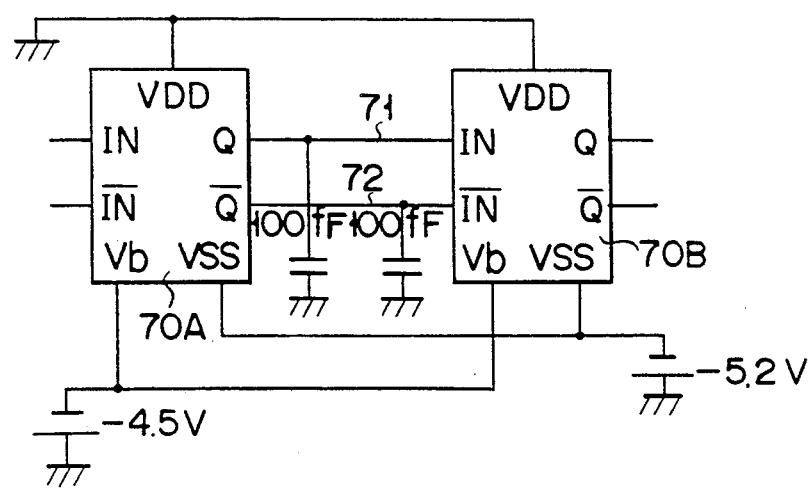
F I G. 6

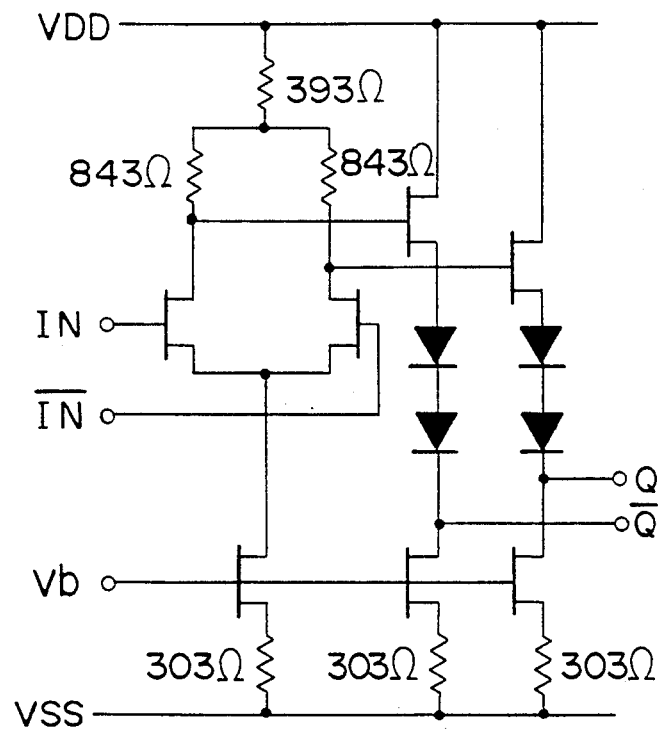
F I G. 7
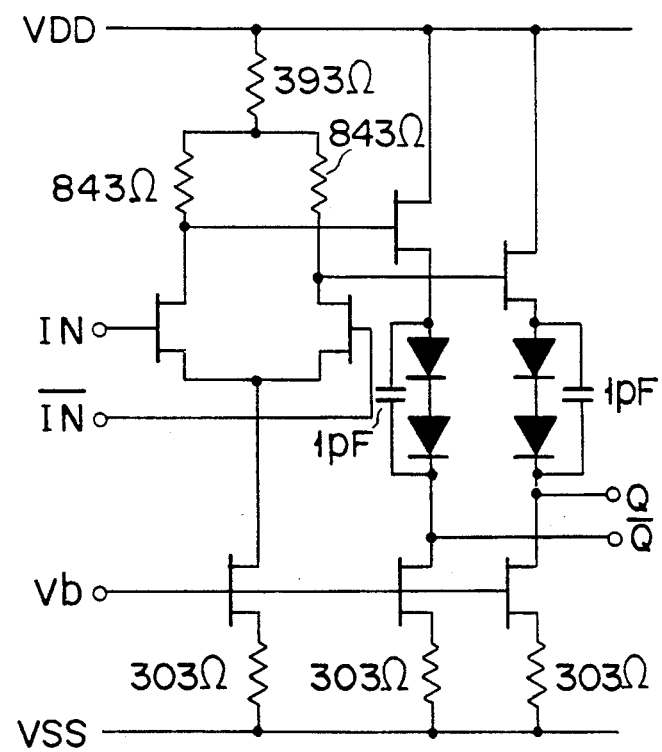
F I G. 8

SOURCE-COUPLED FET LOGIC CIRCUIT

BACKGROUND OF THE INVENTION

1. Field of the Invention

The present invention relates to a source-coupled FET logic (SCFL) circuit having GaAs-FETs and, more particularly to an SCFL circuit for use in a high-speed digital integrated circuit.

2. Description of the Related Art

An SCFL circuit is known in the art as one of the basic GaAs IC circuits for use in high-speed digital integrated circuits. The SCFL circuit has the structure illustrated in FIG. 1.

As is shown in FIG. 1, the SCFL circuit comprises a switching section 10 and a source-follower section 20. The source-follower section 20 is connected to receive an output from the switching section 10.

The switching section 10 has two FETs 11 and 12 having their sources coupled together, thus forming a differential pair. Complementary signals IN and $\overline{\text{IN}}$ are input to the gates of the FETs 11 and 12, respectively, and two signals of the opposite polarities are obtained at the drains of the FETs 11 and 12. The section 10 further comprises a constant current source 13 and three resistors 14, 15 and 16. The resistors 14 and 15 are loads to the FETs 11 and 12, respectively. The resistor 16 functions as a level-shifting element.

The source-follower section 20 is designed to supply a signal which is at a level suitable for the next-stage circuit (not shown), thereby to drive the next-stage circuit. The source-follower section 20 comprises two FETs 21 and 22, a first group of diodes $23_1$ to $23n$, a second group of diodes $24_1$ to $24_n$, and two constant current sources 25 and 26. The FETs 21 and 22 are connected to receive the signals supplied from the drains of the FETs 11 and 12, respectively. The diodes $23_1$ to $23_n$ cooperate to shift the level of the signal output by the FET 21. The diodes $24_1$ to $24_n$ cooperate to shift the level of the signal output by the FET 22. The constant current sources 25 and 26 are connected to the diodes $23_n$ and $24_n$, respectively.

The source-follower section 20 generates two signals Q and $\overline{\text{Q}}$ from the input signals IN and $\overline{\text{IN}}$. The signals Q and $\overline{\text{Q}}$ are supplied to the next-stage circuit.

In the conventional SCFL circuit described above, the diodes $23_1$ to $23_n$ and the diodes $24_1$ to $24_n$, which are used as level-shifting elements in the source-follower section 20, have a resistance component each. Hereinafter, this resistance component will be regarded as an AC component and, thus, will be referred to as "impedance." Due to the impedance, the SCFL circuit has but an insufficient ability of driving the next-stage circuit. Consequently, the conventional SCFL circuit cannot serve to constitute a high-speed digital integrated circuit.

In order to increase that ability of driving the next-stage circuit, it is necessary to use a large-current source and to supply a great current to the source-follower section 20. Obviously, the use of a large-current source results in a great power consumption.

SUMMARY OF THE INVENTION

Accordingly it is an object of the present invention to provide a source-coupled FET logic circuit which has a source-follower section comprising level-shifting elements having a low impedance, and which consumes but a little power and can yet have a sufficient ability of driving the next stage circuit.

According to the invention, there is provided a source-coupled FET logic circuit which comprises: a first node to which a higher voltage power supply is applied; a second node to which a lower voltage power supply is applied; a first FET and a second FET, each having a source, a drain, and a gate, the sources of the first and second FET being connected together, thus forming a source node; a first load element connected between the first node and the drain of the first FET; a second load element connected between the second node and the drain of the second FET; a first constant current source connected between the second node and the source node; a third FET having a source, a drain connected to the first node, and a gate connected to the drain of the first FET; a level-shifting circuit having a first end and a second end, the first end being connected to the source of the third FET; a second constant current source connected between the second node and the second end of the level-shifting circuit; and a capacitance circuit connected in parallel to the level-shifting circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing an SCFL circuit according to a first embodiment of this invention;

FIG. 3 is a circuit diagram showing an SCFL circuit according to a second embodiment of the invention;

FIG. 4 is a circuit diagram illustrating an SCFL circuit according to a third embodiment of the present invention;

FIG. 5 is a circuit diagram showing an SCFL circuit according to a fourth embodiment of this invention;

FIG. 6 is a block diagram showing a circuit for simulating the amplification factor of the conventional SCFL circuit and that of the SCFL circuit according to the invention;

FIG. 7 is a circuit diagram illustrating the conventional SCFL circuit incorporated in the simulation circuit of FIG. 6; and FIG. 8 is a circuit diagram showing the SCFL circuit according to the invention, used in the simulation circuit illustrated in FIG. 6.

DETAILED DESCRIPTION OF THE PREFERRED EMBODIMENTS

Figure 1:
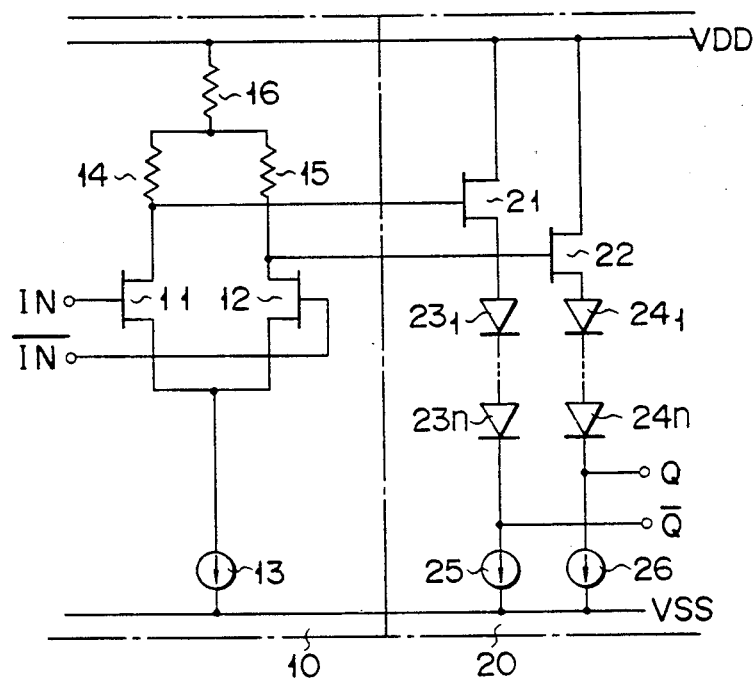
FIG. 1 is a circuit diagram showing a conventional SCFL circuit.

Embodiments of the present invention will now be described in detail, with reference to the accompanying drawings.

FIG. 2 illustrates an SCFL circuit which is an first embodiment of the present invention. As is shown in FIG. 2, the SCFL circuit comprises a switching section 30 and a source-follower section 50. The source-follower section 50 is connected to receive an output from the switching section 30.

The switching section 30 has two FETs 31 and 32 having their sources coupled together, thus forming a differential pair. Complementary signals IN and $\overline{\text{IN}}$ are input to the gates of the FETs 31 and 32, respectively. A resistor 33, which functions as a load element, is connected, at one end, to the drain of he FET 31. Similarly, a resistor 34, which functions as a load element, is connected, at one end, to the drain of the FET 32. These resistors 33 and 34 are connected together at the other end, thus forming a node. This node is connected to one end of a resistor 35 which functions as a level-shifting element. The other end of the resistor 35 is connected to a node 36 to which a higher voltage power supply VDD is applied.

The source node of the FETs 31 and 32 is connected to the drain of a FET 37. The source of the FET 37 is coupled to one end of a resistor 38. The other end of this resistor 38 is connected to a node 39 to which a low-potential power-supply voltage VSS is applied. A predetermined DC bias voltage Vb is applied to the gate of the FET 37. The FET 37 and the resistor 38 constitute a constant current source 40 for supplying a predetermined current to the FETs 31 and 32.

The source-follower section 50 is designed to supply a signal which is at a level suitable for the next-stage circuit (not shown), thereby to drive the next-stage circuit.

As is shown in FIG. 2, the source-follower section 50 comprises two FETs 51 and 52, a first level-shifting circuit 53, a second level-shifting circuit 55, two capacitors 57 and 58, two FETS 59 and 62, and two constant current sources 61 and 64.

The drains of the FETS 51 and 52 are connected to the node 36 to which the VDD is applied. The gate of FET 51 is connected to the drain of the FET 31, and the gate of the FET 52 is connected to the drain of the FET 32. The source of the FET 51 is connected to one end of the first level-shifting circuit 53. The circuit 53 comprises n diodes $54_1$ to $54_n$ connected in series. An anode of the diode $54_1$ is connected to the source of the FET 51. The source of the FET 52 is connected to one end of the second level-shifting circuit 55. This level-shifting circuit 55 also comprises n diodes $56_1$ to $56_n$ connected in series. An anode of the diode $56_1$ is coupled to the source of the FET 52.

The capacitor 57, which is used as a capacitance element, is connected in parallel to the first level-shifting circuit 53. Similarly, the capacitor 58, also used as a capacitance element, is connected in parallel to the second level-shifting circuit 55.

The constant current source 61 comprises a FET 59 and a resistor 60. The resistor 60 is connected, at one end, to the source of the FET 59. The drain of the FET 59 is connected to the other end of the first level-shifting circuit 53. The other end of the resistor 60 is coupled to the node 39 to which the VSS is applied. The DC bias voltage Vb is applied to the gate of the FET 59. Hence, the constant current source 61 supplies a predetermined current to the FET 51 and the first level-shifting circuit 53.

The constant current source 64 comprises a FET 62 and a resistor 63. The drain of the FET 62 is coupled to the other end of the second level-shifting circuit 55. The resistor 63 is connected, at one end, to the source of the FET 62. The other end of the resistor 63 is coupled to the node 39 to which the VSS is applied. The DC bias voltage Vb is applied to the gate of the FET 62. Hence, the constant current source 64 supplies a predetermined current to the FET 52 and the second level-shifting circuit 55.

The other end of the first level-shifting circuit 53, i.e., the cathode of the diode $54_n$, outputs a signal $\overline{Q}$. The other end of the second level-shifting circuit 55, i.e., the cathode of the diode $56_n$, outputs a signal Q.

In operation, when the two input signals IN and $\overline{\text{IN}}$ are at logic "1" and "0" levels, respectively, the FETs 31 and 32 of the switching section 30 are turned on and off, respectively. As a result, a signal at "0" level and a signal at "1" level are supplied to the gates of the FETs 51 and 52 of the source-follower section 50, respectively. Whereby the SCFL circuit outputs a signal $\overline{Q}$ at logic "0" level and a signal Q at logic "1" level. This means that the FET 52 and the second level-shifting circuit 55 has shifted the level of the output signal Q from a VDD level to a VSS level. The output signal $\overline{Q}$ can be at logic "1" level. If this is the case, the FET 51 and the first level-shifting circuit 53 has shifted the level of the output signal $\overline{Q}$ from the VDD level to the VSS level.

The level-shifting circuits 53 and 55, to which the capacitors 57 and 58 are connected in parallel, respectively, have each the impedance Z represented by the following equation:

$$Z = \frac{1}{\frac{1}{R} - \omega C} = \frac{R}{1 - \omega CR} \qquad (1)$$

where R is the total resistance of either level-shifting circuit (i.e., the total resistance of the n diodes), C is the capacitance of the capacitors 57 and 58, $\omega$ is angular frequency ($\omega > 0$).

As is evident from equation (1), $\omega < R$. The impedance Z (i.e., the impedance of either level-shifting circuit) is less than in the case where the capacitors 57 and 58 were not incorporated in the source-follower section 50. Therefore, the SCFL circuit has a sufficient ability of driving the next-stage circuit (not shown). In other words, the SCFL circuit shown in FIG. 2 can serve to constitute a high-speed digital integrated circuit. In addition, neither the constant current source 61 nor the constant current source 64 needs to supply a large current, in order to increase that ability of driving the next-stage circuit. Obviously, the SCFL circuit of FIG. 2 consumes but a little power.

FIG. 3 shows an SCFL circuit which is a second embodiment of the present invention. The same components as those of the first embodiment shown in FIG. 2 will be designated at the same numerals and symbols in FIG. 3, and will not be described in detail.

In the first embodiment (FIG. 2), the signal $\overline{\text{IN}}$, which is complementary to the signal IN, is supplied to the gate of the FET 32 of the switching section 30. In the SCFL circuit of FIG. 3, a predetermined reference DC voltage Vref is applied to the gate of the FET 32. The SCFL circuit of FIG. 3 has the same advantages as the SCFL circuit illustrated in FIG. 2.

FIG. 4 illustrates an SCFL circuit which is a third embodiment of the present invention. The same components as those of the first and second embodiments shown in FIGS. 2 and 3 will be designated at the same numerals and symbols in FIG. 4, and will not be described in detail.

In the first embodiment (FIG. 2), the capacitors 57 and 58, which are used as capacitance elements, are connected in parallel to the first level-shifting circuit 53 and the second level-shifting circuit 55, respectively. By contrast, in the SCFL circuit of FIG. 4, two diodes 65 and 66, both used as capacitance elements, are connected to the level-shifting circuits 53 and 55, in reverse polarity. More specifically, the cathode of the diode 65 is coupled to one end of the first level-shifting circuit 53, i.e., the anode of the diode $54_1$, and the anode of the diode 65 is coupled to the other end of the first level-shifting circuit 53, i.e., the cathode of the diode $54_n$. The cathode of the diode 66 is coupled to one end of the second level-shifting circuit 55, i.e., the anode of the diode $56_1$, and the anode of the diode 66 is coupled to the other end of the second level-shifting circuit 55, i.e., the cathode of the diode $56_n$.

In the third embodiment shown in FIG. 4, the reversely biased diodes 65 and 66 perform the same function as the capacitors 57 and 58 of the first embodiment, because of their parasitic capacitances. Hence, the SCFL circuit of FIG. 4 has the same advantages as the SCFL circuit illustrated in FIG. 2.

FIG. 5 shows an SCFL circuit which is a fourth embodiment of the present invention. The same components as those of the first, second and third embodiments shown in FIGS. 2, 3 and 4 will be designated at the same numerals and symbols in FIG. 5, and will not be described in detail.

In the fourth embodiment (FIG. 5), the total resistance RT of either level-shifting circuit is:

$$RT = \sum_{i=1}^{n} r_i \qquad (2)$$

where n is the number of diodes which form either level-shifting circuit of the same type used in the first, second and third embodiments, and ri is the resistance component of any of the n diodes forming either level-shifting circuit.

The total impedance ZT of either level-shifting circuit is given by the following equation:

$$ZT = \sum_{i=1}^{n} \frac{r_i}{1 - \omega C_i \cdot r_i} \qquad (3)$$

where Ci (i=1 to n) is the capacitance of the capacitance elements connected in parallel to the n diodes of either level-shifting circuit.

Since $\omega > 0$, the impedance ZT is less than the total resistance RT of either level-shifting circuit.

To compare the characteristic of the SCFL circuit of the invention with that of the conventional SCFL circuit, use was made of the simulation circuit shown in FIG. 6. More specifically, two identical SCFL circuits 70A and 70B of the invention were incorporated in the simulation circuit shown in FIG. 6 and were tested. Further, two identical conventional SCFL circuits 70A and 60B were incorporated in the same simulation circuit (FIG. 6) and were tested. In either case, a higher voltage power supply VDD of 0V, a lower voltage power supply VSS of −5.2 V, and a DC bias voltage Vb of −4.5 V were applied to each SCFL circuit, and a parasitic capacitance of, for example, 100 fF is coupled to the two input/output lines 71 and 72 connecting the SCFL circuits 70A and 70B. Two signals at complementary levels were supplied to the first SCFL circuit 70A, and the signals output from the SCFL circuit 70A and at complementary levels were supplied to the second SCFL circuit 70B.

As is shown in FIG. 7, the conventional SCFL circuits incorporated in the simulation circuit of FIG. 6 comprise two level-shifting circuits, each consisting of two diodes. By contrast, as is shown in FIG. 8, in either SCFL circuit of the invention, used in the simulation circuit of FIG. 6, each level-shifting circuit comprises two diodes, and a capacitor of 1 pF connected in parallel to the level-shifting circuit. It should be noted that the SCFL circuits shown in FIGS. 7 and 8 comprise FETs of the same type, each having a gate length of 0.8 μm and a gate width of 18 μm, and diodes of the same type, each having a junction area of 3 μm × 18 μm.

The simulation circuit shown in FIG. 6 was operated, and the amplification factor of the SCFL circuits of the invention, both shown in FIG. 8, and the amplification factor of the SCFL circuits shown in FIG. 7 were measured. The results were: the amplification factor of the conventional SCFL circuits was 83.9%, whereas that of the SCFL circuits illustrated in FIG. 8 was as much as 91.9%.

Needless to say, the invention is not limited to the embodiments described above. Rather, various changes and modifications can be made without departing from the scope and spirit of the present invention. For example, the level-shifting resistor 35 can dispensed with in any of the embodiments, and the resistors 33 and 34 can be connected, at the other end, to the node 36 to which the voltage VDD is applied.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A source-coupled FET logic circuit comprising:
   a first node to which a higher voltage power supply is applied;
   a second node to which a lower voltage power supply is applied;
   a first FET and a second FET, each having a source, a drain, and a gate, the sources of said first and second FET being connected together, thus forming a source node;
   a first load element connected between said first node and the drain of said first FET;
   a second load element connected between said second node and the drain of said second FET;
   a first constant current source connected between said second node and said source node;
   a third FET having a source, a drain connected to said first node, and a gate connected to the drain of said first FET;
   a first level-shifting circuit comprising a plurality of level-shifting elements connected in series each having a first end and a second end, said first end being connected to the source of said third FET;
   a second constant current source connected between said second node and the second end of said first level-shifting circuit;

a first capacitance circuit comprising a plurality of capacitors connected in parallel to the level-shifting elements of said first level-shifting circuit, respectively;

a fourth FET having a source, a drain connected to said first node, and a gate connected to the drain of said second FET;

a second level-shifting circuit comprising a plurality of level-shifting elements connected in series each having a first end and a second end, said first end being connected to the source of said fourth FET;

a third constant current source connected between said second node and the second end of said second level-shifting circuit; and a second capacitance circuit comprising a plurality of capacitors connected in parallel to the level-shifting elements of said second level-shifting circuit, respectively.

* * * * *